United States Patent [19]

Smith

[11] 4,158,987

[45] Jun. 26, 1979

[54] PRESSURE FOOT FOR MACHINE TOOL

[75] Inventor: Joseph E. Smith, Torrance, Calif.

[73] Assignee: Excellon Industries, Torrance, Calif.

[21] Appl. No.: 741,863

[22] Filed: Nov. 15, 1976

[51] Int. Cl.² ............................................. B23C 9/00
[52] U.S. Cl. .................................. 409/80; 409/190;
409/233; 409/903; 144/134 A
[58] Field of Search .................. 90/11 C, 12 D, 15 R,
90/19, DIG. 3, DIG. 16; 144/134 R, 134 A,
134 B, 134 C, 136 R, 252 R; 408/95

[56] References Cited
U.S. PATENT DOCUMENTS

| | | | |
|---|---|---|---|
| 2,675,038 | 4/1954 | Carlson | 144/21 |
| 3,418,883 | 12/1968 | Leibow | 144/134 R |
| 3,587,391 | 6/1971 | Pitts | 90/15 R X |
| 3,770,031 | 11/1973 | Olson | 144/136 R |

*Primary Examiner*—Gil Weidenfeld
*Attorney, Agent, or Firm*—Richard F. Carr

[57] ABSTRACT

This invention provides a frictional clamping arrangement for holding the workpiece being cut by a router so as to prevent movement of the cutout portion of the workpiece in the last increment of the cut. The device includes a pressure foot having a clamping member which is forced downwardly against the surface of the workpiece when the cut is nearly completed for holding the cutout portion of the workpiece motionless relative to the worktable so as to prevent its lateral movement during completion of the cut. The clamping member is fixed relative to the spindle during the principal part of the cut, but is released for limited movement relative to the spindle when holding the workpiece.

38 Claims, 16 Drawing Figures

PRESSURE FOOT FOR MACHINE TOOL

BACKGROUND OF THE INVENTION

1. Field of the Invention

This invention relates to a pressure foot for a machine tool such as a router.

2. Description of the Prior Art

In the operation of automatic routing machines, it is conventional to position a stack of workpieces, such as those used in producing printed circuit boards, on the worktable, holding them in place by tooling pins which extend through openings in the workpieces. For accuracy, there is a close fit between the tooling pins and the workpieces at the openings so that there is no clearance around the pins to permit relative lateral movement. It has been necessary to provide these tooling pins in the portions of the workpieces which are cut out, as well as the portions outside of the cut line, because otherwise the cutout portions will be moved laterally during the cutting operation and an accurate cut will not be produced. The lateral movement of the cutout portion will occur during the last increment of the cut, arising from the lateral force produced by the router bit as the worktable is moved relative to the spindle. Prior to that time, the portion of the workpiece to be cut out will be joined to the portion outside of the cut line by sufficient material to prevent relative movement. When the cut is nearly complete, however, the connecting portion becomes very small and lacks the strength to withstand the lateral force of the router. Thus, unless it has been held by tooling pins or other auxiliary clamping members, the cutout portion will break off or move in any event as the connecting portion is cut through, and its edge will not be accurately formed.

The necessity for using tooling pins in the cutout portions has substantially increased the production time for the machine. The drilling of the various holes for the tooling pins and the close tolerances required take a substantial amount of the operator's time in preparing the workpieces for routing and installing them on the worktable. After the routing operation is complete, additional time is expended in prying the cutout parts off of the tooling pins that hold them. Consequently, the production rate of a routing machine has been slowed and expenses have been increased because of the need for pinning the portions of the workpieces to be cut out.

SUMMARY OF THE INVENTION

The present invention overcomes the difficulties of the prior art by providing a means which will hold the cutout portions of the workpieces without the use of tooling pins or other auxiliary clamps. The efficiency of the routing machine is materially improved and production rate is increased. The result is a reduction in production costs.

The invention provides a member on the routing machine which is forced against the workpiece to clamp it against the worktable during the time that the final part of the cut is made. This holds the cutout portion of the workpiece at the critical time and leaves it entirely free for removal from the machine after completion of the routing cycle.

In carrying out the invention, there may be provided a housing around the spindle and router bit at the lower portion of which is a slide member which is movable laterally relative to the housing. This movement ordinarily is prevented by a locking pin arrangement which extends through an opening in the slide member, but which can be withdrawn to release the slide. Carried by the slide member is a sleeve that circumscribes the router bit and includes an annular member that is held against the surface of the workpiece during routing. This is accomplished by a downward force on the housing. The annular member may be a Teflon O-ring and hence produces relatively low friction drag. Its downward force on the workpiece holds the workpiece flat against the worktable as the worktable moves relative to the spindle in producing the cut in the workpiece, compensating for warpage of the workpiece.

Also included on the slide member is an element of relatively high coefficient of friction, such as a rubber O-ring, with an exposed surface downwardly. The rubber O-ring normally is spaced above the surface of the workpiece. However, when the cut is nearly completed, an increased force is applied to the housing, urging it and the slide member downwardly relative to the spindle causing the high friction rubber O-ring to be brought into engagement with the surface of the workpiece. The Teflon O-ring is retracted against a spring force as this occurs. The engagement of the rubber O-ring with the workpiece is around the router bit so that the rubber O-ring engages the portion of the workpiece within the cut line, as well as outside of the cut. Simultaneously with the forcing of the housing downwardly, the pin is withdrawn from the slide member so that it can move laterally relative to the housing. As the worktable proceeds to move laterally relative to the router for completing the cut, the slide member remains stationary relative to the worktable and, through the high-friction O-ring, holds the cutout portion of the workpiece motionless relative to the worktable. As this takes place, the slide member moves laterally relative to the spindle.

Upon completion of the routing operation, the head of the machine is raised, lifting the housing and associated elements away from the workpiece, with its cutout portion then being free for removal from the machine. Centering springs return the slide member to its original position and the pin is reinserted in the opening in the slide member preparatory for the next cutting operation.

An alternate embodiment includes an arrangement to force a rubber O-ring partially out of its retaining groove for clamping the workpiece during the final portion of the cut.

DESCRIPTION OF THE PREFERRED EMBODIMENT

Figure 1:
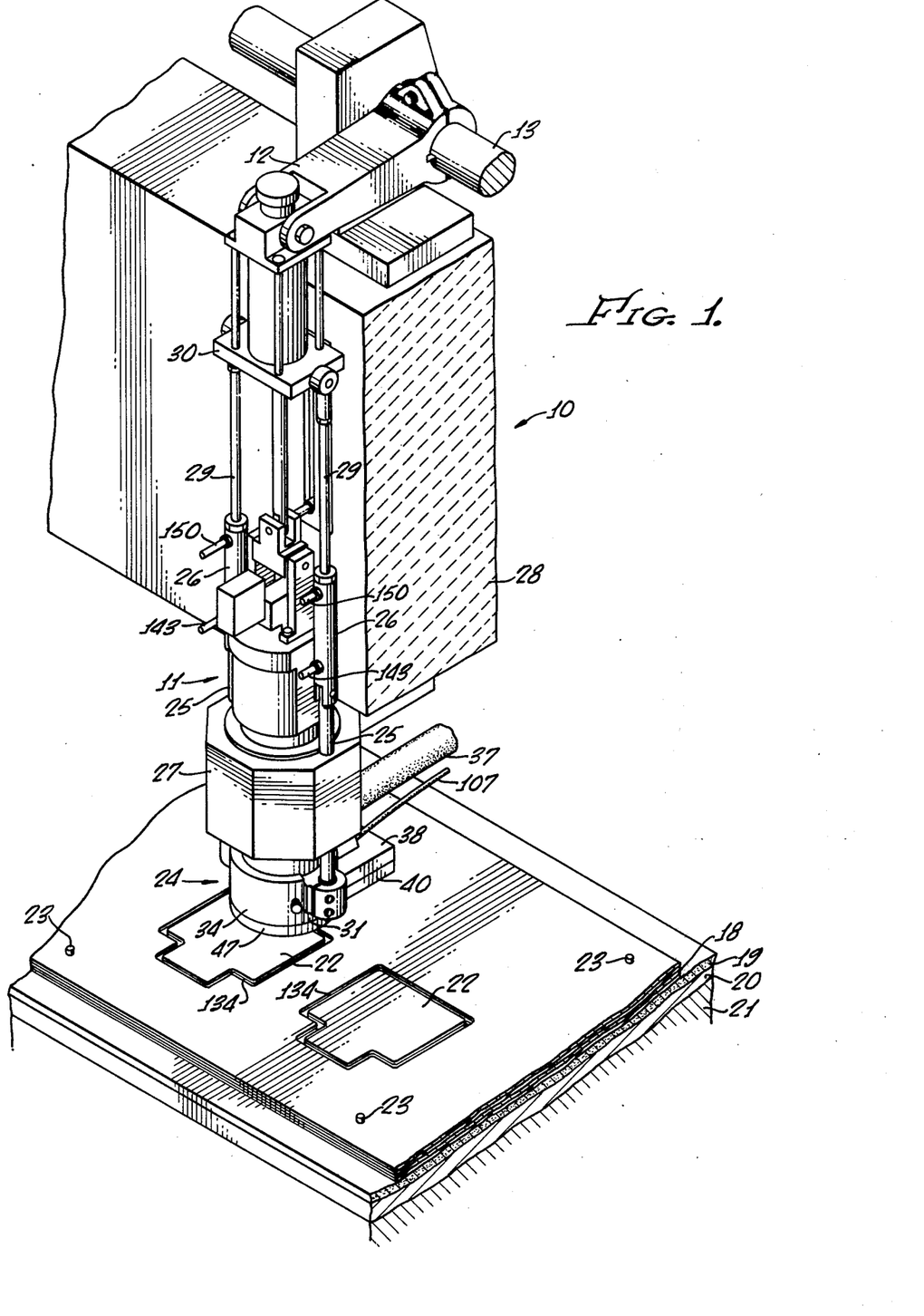
FIG. 1 is a perspective view of a routing machine incorporating the present invention.
Figure 2:
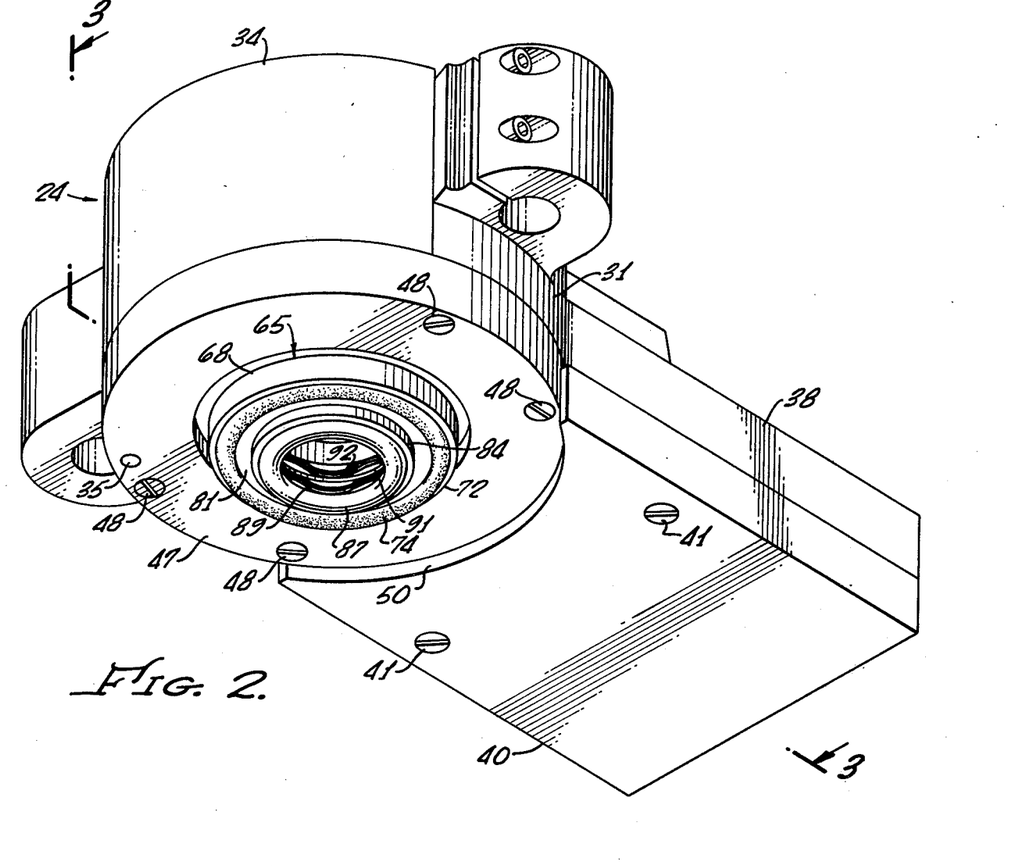
FIG. 2 is an enlarged perspective view of the pressure foot removed from the remainder of the machine.

The routing machine 10, shown in FIG. 1, includes a spindle assembly 11 mounted at the outer end of a crank arm 12. The latter element is keyed to a rotatable shaft 13. Consequently, rotation of the shaft 13 causes the crank arm 12 to pivot for raising or lowering the spindle assembly 11.

Figure 11:
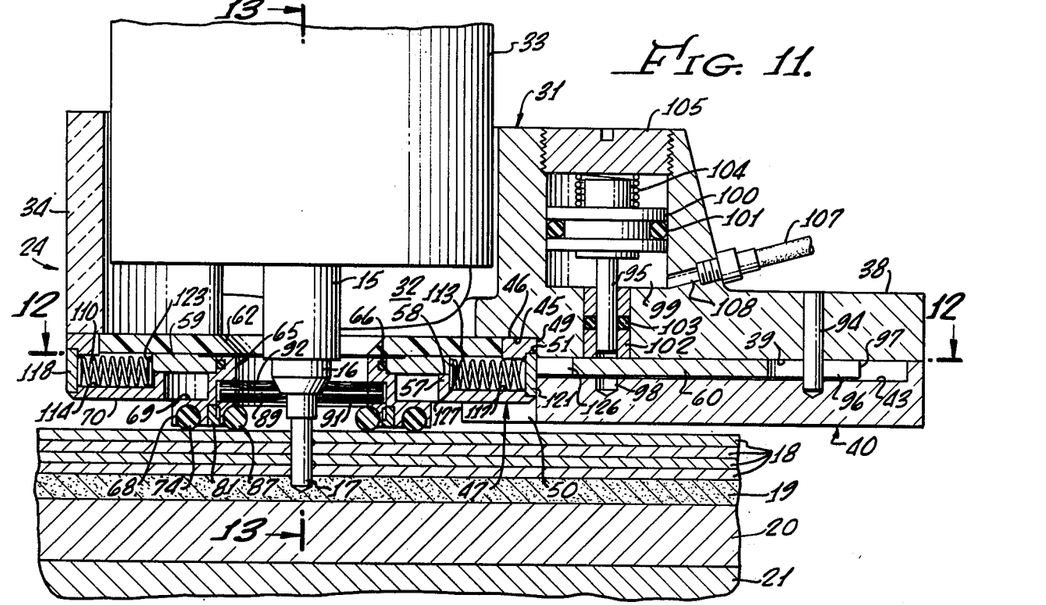
FIG. 11 is a sectional view showing the pressure foot in the clamped position for the final increment of the routing operation.
Figure 13:
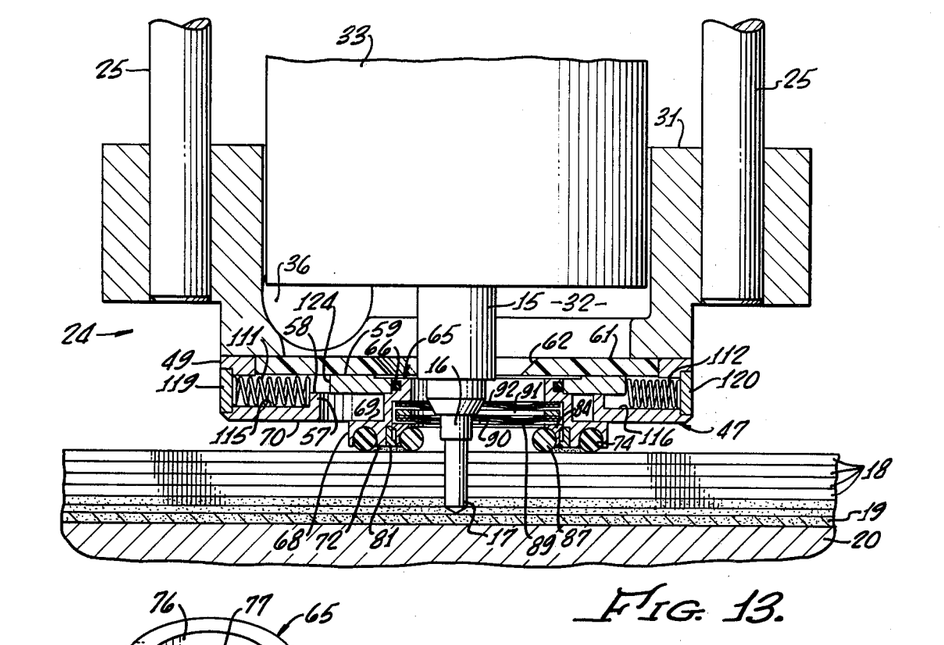
FIG. 13 is a sectional view, taken along line 13—13 of FIG. 11.

At the lower end of the assembly 11, the spindle 15 carries a collet 16, as may be seen in FIGS. 11 and 13, which retains a router bit 17. The latter element is used in cutting a workpiece or a stack of workpieces 18 positioned over a subplate 19 on the upper surface of a tooling plate 20. A worktable, which includes an upper plate 21, supports the tooling plate and is movable laterally in a horizontal plane. In this manner the router bit is able to cut out finished parts, such as the parts 22 shown in FIG. 1.

The stack of workpieces 18 is held on the tooling plate merely by the use of four tooling pins 23 located in areas remote from where the parts 22 are cut out. The cutout parts 22 are not held by the tooling pins 23 and so are unrestrained upon being severed from the workpiece 18. In conventional router use, it would be necessary to include additional tooling pins at the locations of the parts 22 to assure accuracy of cut by preventing part movement at the last portion of the cut. These extra tooling pins are eliminated by the present invention.

A pressure foot 24 is located at the lower end of the spindle assembly 11, carried by two shafts 25 which at their upper ends are connected to a pair of pneumatic cylinders 26. The shafts 25 pass through bearings in a housing 27 that is fixed relative to the beam 28 on which the spindle assembly 11 and crank arm 12 are mounted. The piston rods 29 of the cylinders 26 project from the upper ends of the cylinders and are connected to a transverse plate 30 at the upper portion of the spindle assembly. Consequently, the pressure foot 24 can be moved vertically relative to the spindle assembly 11 by actuation of the pneumatic cylinders 26. This movement is produced by displacing the cylinders 26 axially, which causes similar movement of the shafts 25.

The housing 31 of the pressure foot is shaped to provide a chamber 32 that receives the lower motor drive portion 33 of the spindle assembly and extends below this portion to an open area in the vicinity of the collet 16. A cover 34 of transparent material is connected by a hinge pin 35 to the housing 31, cooperating with the housing to give the chamber a cylindrical configuration. An outlet passageway 36 in the housing 31 extends from the chamber 32 to a hose 37. The latter element is connected, in turn, to a source of a vacuum. This is used in evacuating the cuttings produced during the routing operation.

The housing 31 includes a horizontal rearward extension 38 to the undersurface 39 of which is attached a plate 40 by screws 41. The upper surface of the plate 40 is recessed to provide a chamber 42 having a flat bottom wall 43 which is parallel to the upper edge 44 of the plate.

Figure 5:
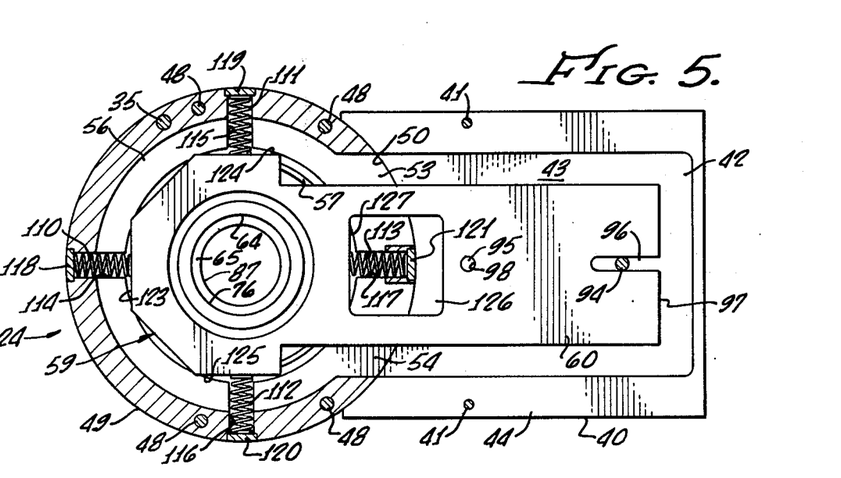
FIG. 5 is a sectional view, taken along line 5—5 of FIG. 3.

In the vicinity of the spindle, the bottom surface 45 of the housing 31 is recessed vertically and engaged by the upper surface 46 of an annular member 47 which is secured to the housing by screws 48. The outer circumferential wall 49 of the annular member 47 engages the curved inner edge 50 of the bottom plate 40, as well as similarly curved edge 51 of the housing which is aligned with the edge 50. Parallel side openings 53 and 54 extend through the circumferential wall 49 of the annular member 47 and collectively are of the same width as the chamber 42 with which they communicate (see FIGS. 5 and 12). Consequently, the interior portion of the annular member 47 forms a continuation of the chamer 42.

Beneath its upper surface 46, the annular member 47 is recessed vertically to a stepped upwardly facing surface 56. At the radially inner end of the surface 56 is an upstanding peripheral flange 57 which defines an opening through the center of the member 47, coaxial with the spindle. The flange 57 has an upper edge 58 located well below the upper surface 46 of the member 47.

A flat slide 59 is received in the annular member 47 above the flange 57, with an elongated projecting rearward portion 60 that extends into the chamber 42. Above the slide 59 and within the peripheral wall 49 of the member 47 is a cover 61 of a low friction material such as tetrafluoroethylene fluorocarbon polymer marketed under the trademark "Teflon." A tapered central opening 62 in the cover 61 is coaxial with the spindle and opens into the chamber 32.

Figures 6, 7:
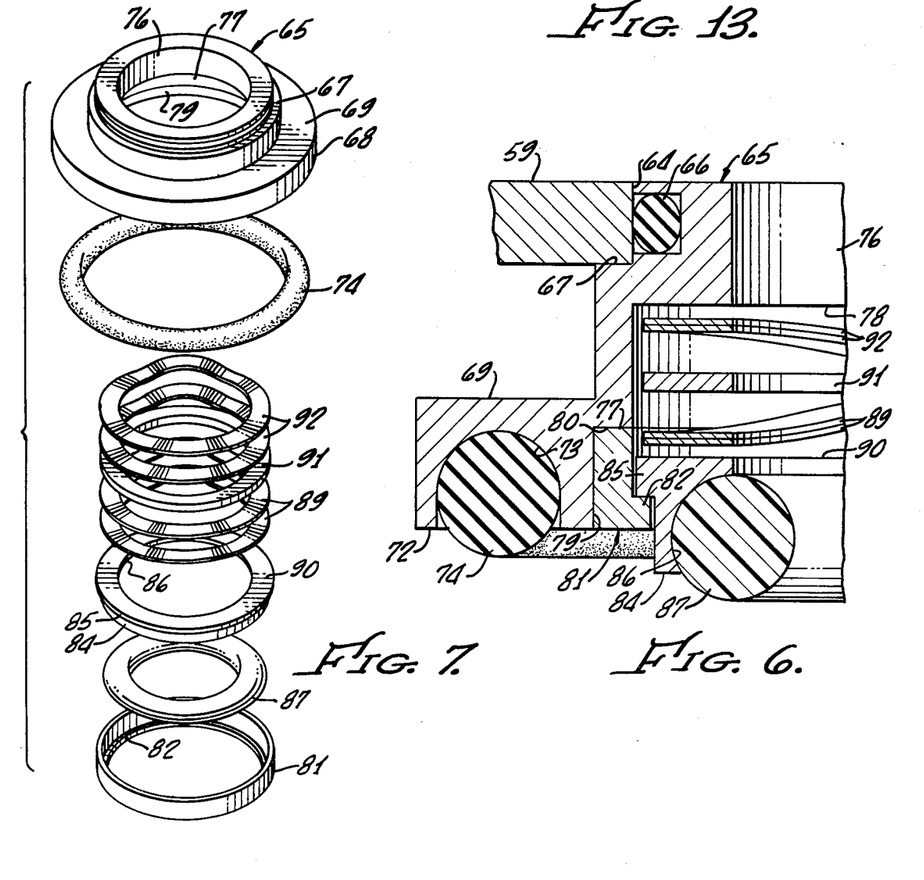
FIG. 6 is an enlarged fragmentary sectional view of the lower portion of the pressure foot.
FIG. 7 is an exploded perspective view of components of the pressure foot.

Within the annular member 47, the slide 59 is wider than at its rearward extension 60 and provided with an opening 64. The upper portion of a sleeve 65 is received in the opening 64, recessed to receive an O-ring 66 that bears against the surface of the slide member 59 at the opening 64. The O-ring 66 is compressed by this engagement, creating a friction that retains the sleeve to the slide member 59. A shoulder 67 on the sleeve 65 engages the lower surface of the slide 59 adjacent the opening 64, thereby positioning the sleeve 65 vertically relative to the slide 59 (FIG. 6). The lower portion of the sleeve 65 extends below the member 47 and includes a wider part 68 with a flat horizontal upwardly facing surface 69. The latter surface is at approximately the plane of the lower surface 70 of the member 47.

The flat horizontal lower surface 72 of the sleeve 65 includes an annular recess 73 which receives an O-ring 74, preferably of an elastomer such as rubber or of other resilient material with a relatively high coefficient of friction. The O-ring 74 has a larger cross sectional diameter than the depth of the recess 73 so that the lower portion of the O-ring 74 projects beneath the bottom surface 72 of the sleeve 65.

The inner surface of the sleeve 65 includes an upper portion 76 of relatively small diameter beneath which is a portion 77 of larger diameter. These are interconnected by a radial shoulder 78. At the lower end of the sleeve 65 there is a bore portion 79 of still greater diameter connected to the portion 77 by radial shoulder 80. This forms a bottom annular recess that receives a ring 81 which is held to the sleeve 65 by a force fit. The inner surface of the ring 81 has the same diameter as the sleeve surface 77, except for an inwardly projecting horizontal flange 82 at the bottom end of the ring 81.

A collar 84 is received within the ring 81, having an outwardly projecting horizontal flange 85 above the flange 82 of the ring 81. An arcuate recess 86 in the inner lower corner of the collar 84 receives an O-ring 86 of Teflon or other low friction material.

Figure 3:
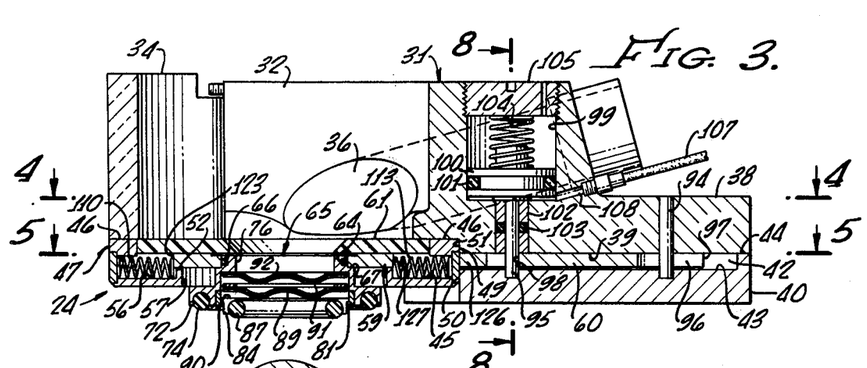
FIG. 3 is a longitudinal sectional view, taken along line 3—3 of FIG. 2.
Figure 4:
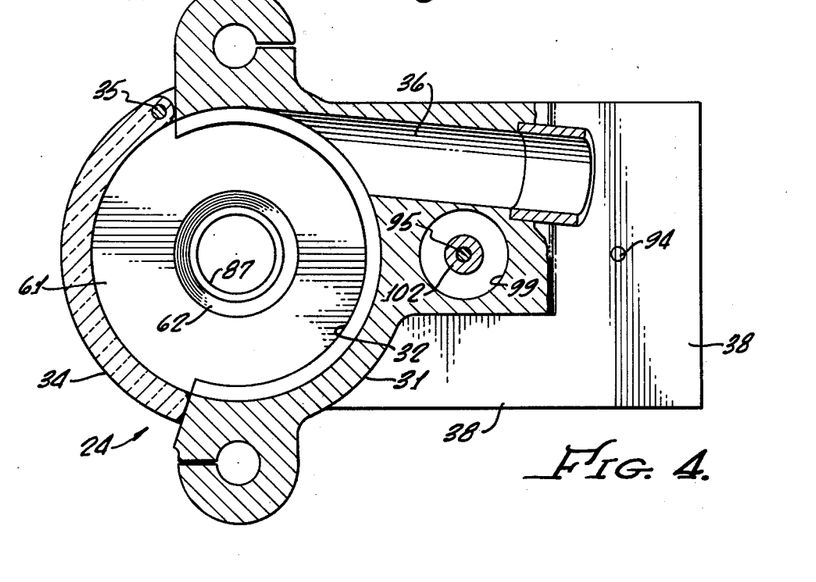
FIG. 4 is a sectional view, taken along line 4—4 of FIG. 3.
Figure 10:
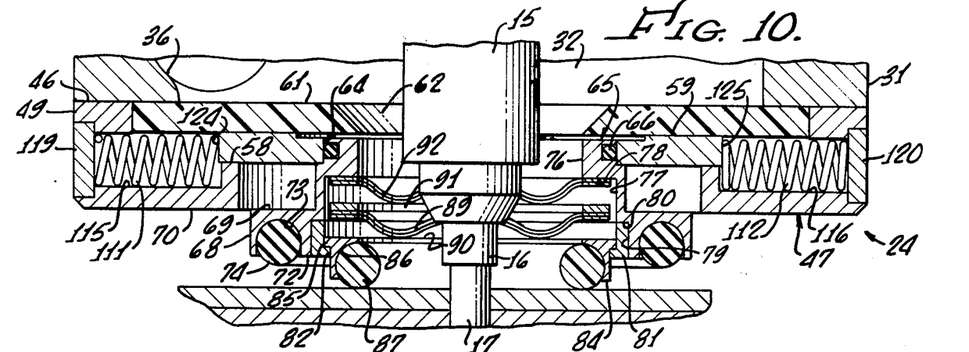
FIG. 10 is an enlarged fragmentary sectional view showing the pressure foot as positioned during the major part of the routing of the workpiece.

The collar 84 normally is pushed downwardly by a spring force to the position in FIGS. 3, 6 and 10 so that its flange 85 engages the flange 82 of the ring 81. The spring force is produced by an assembly that includes two undulant annular springs 89, the lowermost one of which bears against the upper surface 90 of the collar 84. Above the springs 89 is a washer 91 above which is a second pair of undulant annular springs 92. The latter springs bear against the radial shoulder 78 of the sleeve 65 and the washer 91. The two sets of springs 89 and 92, therefore, cooperate to bias the collar 84 to its normal lowered position in which the low friction O-ring 87 is located beneath the housing 31 to engage the uppermost workpiece 18.

The periphery of the slide 59 has a smaller lateral dimension than the inner surface of the wall 60 of the annular member 47, and its rearward extension 59 is smaller laterally than the chamber 42. Consequently, the slide member 59 and the elements connected to it are movable a limited distance in all directions horizontally relative to the housing 31. Such movement normally is prevented, however, by means of vertical pins 94 and 95. The pin 94 extends downwardly through the rearward extension 38 of the housing 31, through the chamber 42 and into the bottom plate 40. This pin is received in a longitudinal slot 96, which extends inwardly from the central portion of the end edge 97 of the extension 60 of the slide 59. The slot 96 is substantially the same width as the pin 94.

The other pin 95 is parallel to the pin 94, but inwardly of it, passing through the chamber 43 and into the plate 40. The pin 95 normally fits within a complementary opening 98 in the portion 60 of the slide 59, this opening being continued in the plate 40 to receive the end of the pin. The upper end of the pin 95 is received in a cylindrical chamber 99 in the housing 31, connecting to a piston 100 which is sealed relative to the cylinder 99 by an O-ring 101. A sleeve 102 in the housing 31 beneath the chamber 99 provides a bearing surface for the pin 95 and is split at its central region for an O-ring 103 that forms a pneumatic seal around the pin 95.

Figure 8:
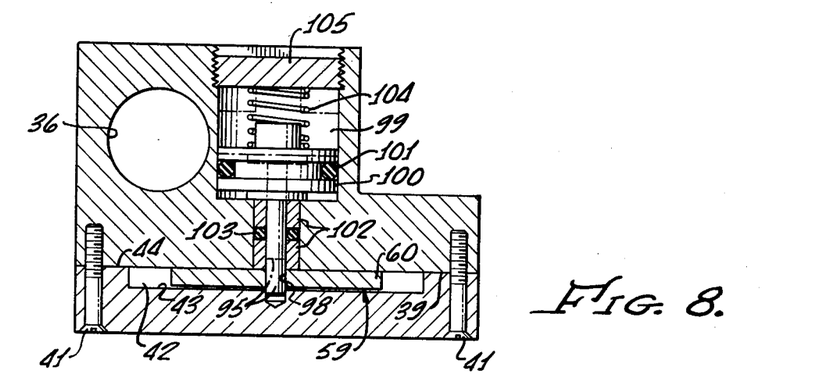
FIG. 8 is a transverse sectional view, taken along line 8—8 of FIG. 3.

Above the piston 100 is compression spring 104, the lower end of which bears against the piston and the upper end of which engages a threaded plug 105 that closes the upper end of the cylindrical chamber 99. Consequently, the spring 104 biases the piston 100 downwardly to the position of FIGS. 3 and 8 where the pin 95 extends through the opening 98 in the slide 59, as described above. However, the pin 95 can be withdrawn from the opening 98 and the slide 59 by raising the piston 100. This may be accomplished by admitting compressed air into the chamber 99 below the piston 100 through an air line 107 connecting to a port 108. The elevated position of the piston 100 and pin 95 may be seen in FIG. 11. When the pin 95 is withdrawn from the slide 59, the latter element is free to move laterally relative to the housing 31, although its rearward end portion will pivot about the permanently positioned pin 94 at the slot 96.

The slide 59 is resiliently biased to a centered position relative to the annular member 47 and the spindle by means of four compression springs 110, 111, 112 and 113. The outer ends of the springs 110, 111, 112 and 113 are received within openings 114, 115, 116 and 117, respectively, in the circumferential wall 49 of the member 47, bearing against plugs 118, 119, 120 and 121. The inner ends of the springs 110, 111 and 112 bear against flat surfaces 123, 124 and 125, respectively, on the periphery of the slide 59. An opening 126 in the rearward extension 60 of the slide 59 receives the segment of the wall 49 between the openings 53 and 54, and provides a flat surface 127 that is engaged by the inner end of the spring 113. The surfaces 123, 124, 125 and 127 are equally spaced from the center of the opening 64 through the slide 59 and chordal with respect to an imaginary circle concentric with the opening 64. The spacing between the opposite surfaces 123 and 127, and between the opposite surfaces 124 and 125, is approximately equal to the outside diameter of the flange 57 of the annular member 47. The springs 110, 111, 112 and 113 are positioned so that their lower portions are aligned with the flange 57 with their upper portions being engageable with the flat surfaces on the slide 59. Consequently, these springs cannot move beyond the flange 57 irrespective of the amount of lateral movement of the slide 59.

In use of the machine, pressure is introduced into the lower ends of cylinders 26 so that they are extended prior to the lowering of the machine head.

After this, the shaft 13 is rotated to pivot the crank arm 12 downwardly, thereby lowering the spindle assembly 11. The router bit 17 then enters the stacked workpieces 18 to initiate the cut. As this occurs, the Teflon O-ring 87 engages the uppermost workpiece 18 and the pressure foot moves no further. As the downward movement of the head of the machine continues in causing the router bit 17 to penetrate the entire stack of workpieces 18 and enter the backup board 19, there is some downward displacement of spindle relative to the pressure foot 24. This moves the pistons downwardly in the cylinders 26, further compressing the air in the lower end of the cylinders. As a result the pressure foot 24 exerts a force against the workpieces 18, holding them flat against the upper surface of the tooling plate 20.

The force transmitted through the Teflon O-ring 87 and collar 84 is insufficient to overcome the springs 89 and 92. Consequently, the collar remains in its downwardly extended position.

Figures 9, 14, 15:
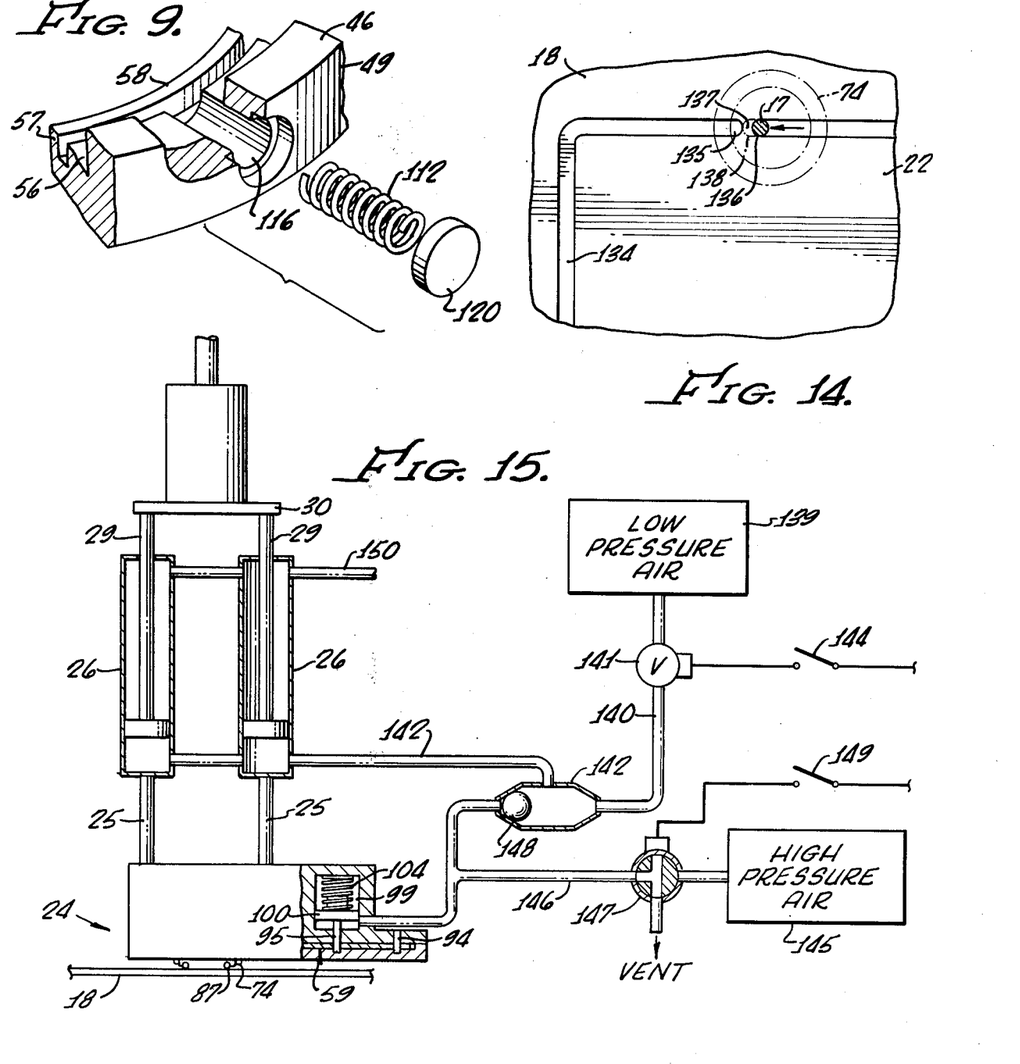
FIG. 9 is a fragmentary perspective view showing the arrangement for receiving and retaining the centering springs.
FIG. 14 is a fragmentary plan view of the workpiece illustrating the path of the router in making the cut.
FIG. 15 is a schematic view of the pressure foot control.

The table 21 then is moved laterally so that the router bit 17 produces a cut 134 in the workpieces 18 in a predetermined pattern, such as that shown in FIGS. 1 and 14. The Teflon Ring 87 slides easily over the surface of the uppermost workpiece 18 as this occurs. The workpieces are held laterally fixed on the tooling plate 20 by the tooling pins 23 as the cut is made. The cut 134 is made around the periphery of the printed circuit board 22 being cut out, from the point 135 where the cut was initiated to a point 136 where the cut is almost complete. In this position, there is some remaining material 137 between the points 135 and 136 which is just sufficient to withstand the lateral force of the router bit 17 and hold the cutout portion rigidly fixed relative to the remainder of the workpiece. Typically, around ¼ inch of material remains in this uncut portion. Upon any appreciable additional cutting, however, such as to the position 138, there would be insufficient material interconnecting the cutout part to the remainder of the workpiece to prevent relative movement of the cutout part.

At this time, without stopping the machine, the lower portions of the cylinders 26 are subjected to a substantially higher air pressure than that existing in the cylinders 26 during the normal cutting operation. Consequently, the pressure foot 24 is pushed with a much greater force against the workpieces 18. This force is sufficient to overcome the bias provided by the undulant annular springs 89 and 92 so that the pressure foot assembly moves downwardly relative to the collar 84 and the Teflon O-ring 87. This brings the outside O-ring 74 of rubber or other high friction material to bear against the surface of the stack of workpieces 18. The air pressure in the cylinders 27 is sufficient to cause the O-ring 74 to exert a substantial force against the workpiece 18. The O-ring 74, by circumscribing the router bit 17, engages both the cutout printed circuit board portion 22 within the cut line 134 and the outer portions of the workpiece 18 outside the cut line 134. By being pressed tightly against the tooling plate 20 by the O-ring 74, the portion of the workpiece within the cut line 134 becomes clamped and held against lateral movement relative to the table.

Figure 12:
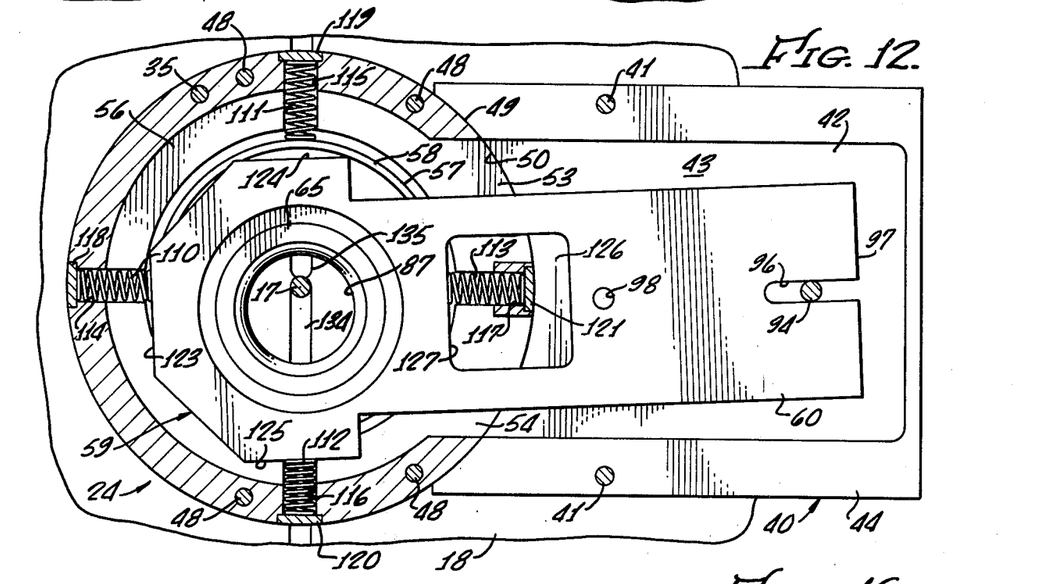
FIG. 12 is a sectional view, taken along line 12—12 of FIG. 11.

At the time the pair of cylinders 26 receives the increased clamping pressure, pressurized air is ported through the line 107 to the lower end of the cylinder 99. This air pushes the piston 100 upwardly against the force of the compression spring 104, withdrawing the pin 95 from the opening 98 in the rearward portion 60 of the slide 59. Consequently, the slide 59 is released and can move laterally relative to the housing 31 of the pressure foot and hence relative to the spindle. As the table 21 then continues to move to complete the cut, the slide 59, at its forward portion around the router bit 17, moves with the table. This effect is shown in FIGS. 12 and 13 where the forward portion of the slide 59 is shown displaced to one side, compressing the spring 112. The slide 59 bears against the Teflon cover 61 as the pressure foot is forced downwardly, and so moves freely relative to the housing 31. The continued clamping force assures that the cutout portion 22 makes no movement relative to the outer part of the workpiece beyond the cut 134 as the final increment of material 137 is severed and the cut is completed. Therefore, even though there are no tooling pins holding the cutout printed circuit board 22, it does not move relative to the table at any time during the routing operation and a perfectly smooth and accurate cut is obtained all the way around its periphery.

After the cut 134 is complete, the pressure in the power cylinders 26 is relieved and the head of the machine is raised by rotating the crank arm 12 upwardly. Consequently, the clamping force no longer is exerted against the workpiece and the centering springs again position the slide 59 so that its central opening 64 is concentric with the spindle. In the example illustrated, the spring 112 pushes on the surface 125 of the slide 59 to return it to the center position where it is intermediate the springs 111 and 112. With the centering springs being limited in their travel by the flange 57, their inner ends are located with precision and there is a complete ability to center the slide 59. Thus, the slide 59 is centered relative to the flange 57 and not relative to two opposed spring forces as would be the case if the flange 57 were not included.

In addition, the pressure is vented from the cylinder 99. The spring 104 pushes the piston 100 downwardly causing the pin 95 to enter the opening 98 in the slide 59, locking the slide relative to the housing 31. In this way the cycle is completed and the router is ready for another cut.

The relatively low pressure air for the cylinders 26 during the routing operation is provided by an air source 139 from which extends a line 140 controlled by a solenoid operated valve 141, as shown in the schematic illustration of FIG. 15. The line 140 connects to one end of a ball check shuttle valve 142. A line 143 extends from the outlet of the shuttle valve 142 to to the lower ends of cylinders 26. To pressurize the cylinders, the valve 141 is opened by closing a switch 144 to actuate the solenoid, so that pressurized air from the source 139 can flow through the lines 140 and 143 to the cylinders.

The source of high pressure air 145 for clamping the workpiece is connected by a line 146 to the opposite end of the shuttle valve 142, as well as to the line 107 that leads to the cylinder 99. A solenoid operated three-way valve 147 controls the flow in the lines 107 and 146. At the time the cylinders 26 are to be at the lower pressure, the valve 147 is vented to atmosphere. Consequently, the low pressure air from the source 139 forces the ball 148 of the shuttle valve 142 against the seat adjacent the line 146 and the low pressure air can flow through the shuttle valve to the cylinders 26. The cylinder 99 is unpressurized so that the spring 104 holds the piston 100 down and the pin 95 in the slide 59.

To exert the higher clamping pressure in the cylinders 26, the switch 149 is closed, activating the solenoid of the valve 147. This repositions the valve 147 to open the line 146. The high pressure air then forces the ball 148 to the opposite end of the shuttle valve 142 so that it engages the seat adjacent the line 140. The high pressure air then communicates with the lower ends of the cylinders 26 through the shuttle valve 142.

Simultaneously, the pressurized air from the source 145 enters the line 107 and flows to the cylinder 99. This raises the piston 100, withdrawing the pin 95 and releasing the slide 59.

Returning the valve 147 to the vent position bleeds the high pressure air from the cylinders 26 and allows the low pressure air to be exerted. This also depressurizes the cylinder 99.

The line 150 to the upper ends of the cylinders 26 is used in retracting the pressure foot when the spindle is to be deactivated.

Although the machine can be constructed for manual control, computer controls normally are used in operating and sequencing the valves.

Figure 16:
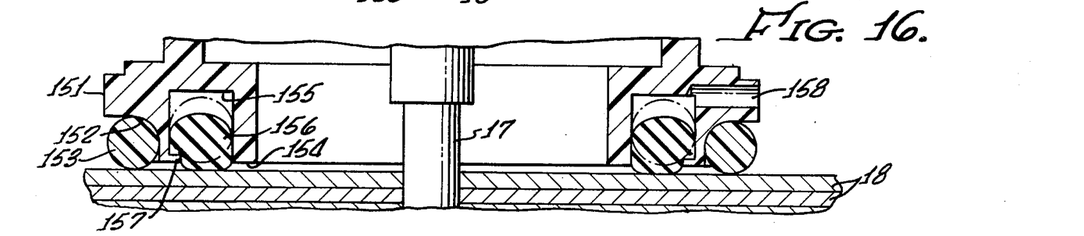
FIG. 16 is an enlarged fragmentary sectional view of a modified form of the invention.

In the modification of the invention shown in FIG. 16, the sleeve 65 and its associated elements are replaced with a sleeve 151. The latter member is attached suitably to the slide 59 such as by means of a friction O-ring connection as for the sleeve 65. Around the outer periphery of the sleeve 151, at its outside corner, is a recess 152 which retains a Teflon O-ring 153. This positions the O-ring 153 so that it projects below the lower surface 154 of the sleeve 151. Consequently, the Teflon O-ring 153 can bear against the workpiece during the normal routing operation.

An annular recess 155 extends inwardly from the lower surface 154 and receives an O-ring 156 which is of rubber or other resilient, high friction material. A narrow flange 157 along the outer edge of the recess 155 retains the O-ring within the recess.

When the cut is nearly complete, the locking of the cutout portion to the table is not accomplished by a downward force on the pressure foot, as in the previously described embodiment. Instead, pressurized air is introduced into the annular recess 155 above the O-ring 156, being admitted through a port 158. This forces the O-ring downwardly and partially out of the recess 155, below the surface 154 and the sleeve 151, to engage the upper workpiece 18. The O-ring 156 thereby exerts a frictional force, clamping the cut portion of the workpiece down on the table 21. Consequently, the slide 59 remains in position as the worktable moves onwardly in completing the cut. The locking effect is the same as before as there is no movement of the cut portion of the workpiece during the final stages of the routing.

When the cut is complete, the air is bled from the recess 155 above the O-ring 156, thereby releasing the parts on the table. The resilience of the O-ring 156 causes it to retract within the recess 155 to its original position, ready for the next cut.

The foregoing detailed description is to be clearly understood as given by way of illustration and example only, the spirit and scope of this invention being limited solely by the appended claims.

I claim:

1. In combination with a machine tool having a spindle means, a cutting tool rotatable by said spindle means and worktable means for supporting a workpiece for being cut by said cutting tool, said worktable means and said spindle means being relatively laterally movable for producing a cut in said workpiece along a predetermined line, which cut upon completion thereof will produce a cutout part from the portion of said workpiece within said line, said cutting tool exerting a relative lateral force on said workpiece such that when said cutting tool has reached a predetermined point on said line and prior to completion of said cut, said cutting tool will cause lateral motion of said portion of said workpiece relative to said worktable means unless said portion is restrained, a device for selectively restraining said portion of said workpiece comprising clamping means, said clamping means including workpiece-engaging means, and means operable when said cutting tool has made a substantial portion of said cut for causing said workpiece-engaging means to engage the surface of said portion of said workpiece and force said portion of said workpiece against said worktable means for preventing movement thereof relative to said worktable means during completion of said cut, said worktable means and said workpiece engaging means being relatively laterally movable during said cut and prior to said completion of said cut, said work-piece-engaging means exerting no substantial restraint against such lateral motion of said portion of said workpiece when said cutting tool makes said substantial portion of said cut.

2. A device as recited in claim 1 in which said workpiece-engaging means is laterally stationary relative to said spindle means and laterally movable relative to said worktable means during said substantial portion of said cut, and is laterally stationary relative to said worktable means and laterally movable relative to said spindle means when so forcing said portion of said workpiece against said worktable means during said completion of said cut.

3. A device as recited in claim 2 in which said clamping means includes releasable stop means for rigidly holding said workpiece-engaging means laterally stationary relative to said spindle means during said substantial portion of said cut, and resilient means biasing said workpiece-engaging means to a predetermined lateral position relative to said spindle means.

4. A device as recited in claim 3 in which said stop means so rigidly holds said workpiece-engaging means in said predetermined lateral position relative to said spindle means.

5. A device as recited in claim 1 in which said workpiece-engaging means includes means for engaging the surface of said workpiece when said cutting tool makes said substantial portion of said cut, forcing said workpiece against said worktable means with a lesser force than that which is exerted during said completion of said cut, whereby said workpiece is held thereby against said worktable means during said substantial portion of said cut but is unrestrained against lateral movement relative to said worktable means.

6. A device as recited in claim 5 in which said workpiece-engaging means includes a first element for so engaging the surface of said workpiece when said cutting tool makes said substantial portion of said cut, said first element having a relatively low coefficient of friction, and a second element for so engaging the upper surface of said portion of said workpiece during said completion of said cut, said second element having a relatively high coefficient of friction.

7. A device as recited in claim 6 in which said first and second elements circumscribe said cutting tool.

8. A device as recited in claim 6 in which said second element has a larger diameter than said first element.

9. A device as recited in claim 6 in which said clamping means includes a body laterally fixed relative to the axis of said spindle means, said second element being laterally movable relative to said body during said completion of said cut.

10. A device as recited in claim 9 including means for preventing lateral movement of said second element relative to said body during said substantial portion of said cut, and for releasing said second element for allowing lateral movement of said second element relative to said body during said completion of said cut.

11. In combination with a machine tool having a spindle, a cutting tool rotatable by said spindle, a worktable means beneath said cutting tool for supporting a workpiece, said worktable means being movable laterally relative to said cutting tool for causing said cutting tool to produce in said workpiece a cut along a predetermined line which cut upon completion thereof will produce a cutout part from the portion of said workpiece within said line, said cutting tool exerting a relative lateral force on said workpiece such that when said cutting tool has reached a predetermined point on said line and prior to completion of said cut, said cutting tool will cause lateral motion of said portion of said workpiece relative to said worktable means unless said portion is restrained, a device for selectively holding said portion of said workpiece within said cut line comprising a body adjacent said spindle and fixed against lateral movement relative to said spindle, a workpiece-engaging means carried by said body and movable laterally relative to said body, and force means operable when a substantial portion of said cut has been made for forcing said workpiece-engaging means against said portion of said workpiece for clamping said portion of said workpiece against said worktable means and preventing lateral movement of said portion of said workpiece relative to said worktable means, whereby upon said relative movement of said worktable means and said cutting tool during the completion of said cut said workpiece-engaging means is stationary relative to said worktable means and moves laterally relative to said body.

12. A device as recited in claim 11 including means for forcing said workpiece-engaging means against said workpiece when said cutting tool makes said substantial portion of said cut at a lower force than when said workpiece-engaging member so clamps said portion of said workpiece against said worktable means, for holding said workpiece flat on said worktable means as said cutting tool makes said substantial portion of said cut.

13. A device as recited in claim 11 including in addition means for preventing lateral movement of said workpiece-engaging means relative to said body while said cutting tool makes said substantial portion of said cut, and for releasing said workpiece-engaging means and allowing said lateral movement of said workpiece-engaging means relative to said body during said completion of said cut.

14. A device as recited in claim 11 in which said workpiece-engaging means includes a first element having a relatively low coefficient of friction for engaging said workpiece when said cutting tool makes said substantial portion of said cut, and a second element having a relatively high coefficient of friction for so being forced against said portion of said workpiece for so clamping the same and preventing lateral movement thereof relative to said worktable means during said completion of said cut.

15. A device as recited in claim 14 in which said second element comprises an annular member circumscribing said cutting tool.

16. A device as recited in claim 14 in which said second element is an O-ring of elastomeric material.

17. A device as recited in claim 15 in which said first element comprises an annular member circumscribing said cutting tool.

18. A device as recited in claim 16 in which said first element is an O-ring of tetrafluoroethylene fluorocarbon polymer.

19. A device as recited in claim 14 in which said workpiece-engaging means includes a member carrying said first element and said second element, and including centering means for normally holding said workpiece-engaging means in a predetermined position relative to said body.

20. A device as recited in claim 19 in which said centering means includes a first holding means for rigidly holding said workpiece-engaging means in said predetermined position, and a second holding means for resiliently biasing said workpiece-engaging means toward said predetermined position, said first holding means being releasable upon said forcing of said second element against said workpiece for allowing said lateral movement of said workpiece-engaging means relative to said body in opposition to said second holding means.

21. A device as recited in claim 20 in which said first holding means includes a pin, said workpiece-engaging means having an opening for receiving said pin, and including means for removing said pin from said opening for so releasing said workpiece-engaging means.

22. A device as recited in claim 21 in which said first holding means includes a cylinder, a piston in said cylinder, said pin being connected to said piston, resilient means for biasing said piston in one direction for forcing said pin into said opening in said workpiece-engaging means, and a source of pressurized fluid for forcing said piston in the opposite direction for so removing said pin from said opening in said workpiece-engaging means.

23. A device as recited in claim 20 in which said second holding means includes at least four springs engaging said member at spaced locations.

24. In combination with a router having a spindle assembly including a spindle, a collet and a router bit, a worktable beneath said router bit for supporting a workpiece, said worktable being movable laterally relative to said router bit for causing said router bit to produce in said workpiece a cut along a predetermined line, which cut upon completion thereof will produce a cut-out part from the portion of said workpiece within said line, said router bit exerting a relative lateral force on said workpiece such that when said router bit has reached a predetermined point on said line and prior to completion of said cut, said router bit will cause lateral motion of said portion of said workpiece relative to said worktable unless said portion is restrained, a device for selectively holding said workpiece comprising a housing carried by said spindle assembly, said housing defining a chamber around said spindle assembly, a slide member in said chamber, said slide member being substantially parallel to said worktable and having an opening receiving said router bit, a first annular member of relatively high coefficient of friction carried by said slide member, said first annular member circumscribing said router bit and having a projecting face adjacent said worktable, a second annular member of relatively low coefficient of friction, a support member carrying said second annular member so that said second annular member circumscribes said router bit, and has a projecting face adjacent said worktable, a first spring means biasing said support member to an outer position where said second annular member projects beyond said first annular member for engaging a workpiece on said worktable, a second spring means biasing said slide member to a normal centered position within said chamber, lock means holding said slide member in said centered position, means for pressing said housing toward said worktable with a first force sufficient to cause said second annular member to bear against such a workpiece and hold said workpiece flat on said table while said router bit produces such a cut in said workpiece, means for pressing said housing toward said worktable with a second and larger force sufficient to cause said support member to be pushed inwardly in opposition to said first spring means to a retracted position and to bring said first annular member into engagement with said workpiece around said router bit for holding said workpiece, including the portion thereof within said cut line, against movement relative to said worktable during the final increment of said cut for thereby preventing motion of said cutout portion of said workpiece relative to the remainder of said workpiece, and means for releasing said lock means and permitting said slide member to move within said chamber relative to said housing during said final increment of said cut, said last-mentioned means being operable substantially simultaneously with said means for pressing said housing toward said workpiece with a second and larger force.

25. A device as recited in claim 24 in which said housing includes a bearing member of material of relatively low coefficient of friction positioned above said slide member for facilitating movement of said slide member relative to said chamber upon said release of said lock means.

26. The method of producing a cutout part from a workpiece of larger lateral dimension than that of said cutout part comprising the steps of positioning said workpiece on a supporting surface, holding said workpiece against lateral movement relative to said supporting surface by engaging a first portion of said workpiece, engaging a second portion of said workpiece remote from said first portion thereof by a rotating cutting tool, producing relative lateral movement between said cutting tool and said workpiece in a predetermined pattern so as to cut said workpiece along a predetermined line, such that at a first predetermined position along said line a cutout part remote from said first portion of said workpiece and unrestrained by said engagement of said first portion of said workpiece will be produced from said workpiece, and such that at a second predetermined position along said line immediately adjacent said first predetermined position said cutting tool will produce a lateral force on the portion of said workpiece interconnecting said cutout part and the adjacent portions of said workpiece sufficient to cause movement of said cutout part laterally relative to said supporting surface if said cutout part is unrestrained against such movement, biasing a means against said workpiece for biasing said workpiece against said supporting surface during said relative lateral movement between said workpiece and said cutting tool while holding said means substantially laterally fixed relative to said cutting tool, and then releasing said means so that said means is laterally movable relative to said cutting tool, and engaging said cutout part by said means adjacent said cutting tool before said cutting tool reaches said second predetermined position and forcing said cutout part against said supporting surface such that said cutout part is held against movement relative to said supporting surface as said cutting tool reaches said second and said first predetermined positions.

27. The method as recited in claim 26 in which said engagement of said cutout part adjacent said cutting tool is made immediately prior to said cutting tool's reaching said second predetermined position.

28. The method as recited in claim 26 in which said means is provided with a first member having a relatively high coefficient of friction that is so engaged with said cutout part adjacent said cutting tool, and a second member having a relatively low coefficient of friction for pressing said workpiece in the vicinity of said cutting tool against said supporting surface prior to so engaging said cutout part by said first member, thereby causing said second member to slide over the surface of said workpiece prior to so engaging said cutout part by said first member.

29. The method as recited in claim 28 in which said first member is pressed against said cutout part with a greater force than the force with which said second member is pressed against said workpiece.

30. The method as recited in claim 28 in which first member is engaged with said workpiece in the vicinity of said cutting tool so as to engage both said cutout part and portions of said workpiece adjacent thereto.

31. The method as recited in claim 30 in which both said first member and said second member are made annular and are positioned concentrically around said cutting tool.

32. The method as recited in claim 31 in which said first member is given a larger diameter than said second member.

33. The method of producing a cutout part from a workpiece of larger lateral dimension than that of said cutout part comprising the steps of providing a rotatable cutting tool and a worktable adjacent said cutting tool, positioning a workpiece on said worktable, engaging said workpiece at a first location and restraining said workpiece at said first location against lateral movement thereof relative to said worktable, rotating said cutting tool and simultaneously causing relative movement of said cutting tool and said worktable such that said cutting tool engages said workpiece and produces a cut therein along a predetermined line remote from said first location such that upon completion of said cut a cutout part will be produced which is unrestrained by said engaging of said workpiece at said first location, engaging said workpiece adjacent said cutting tool by a means and pressing said workpiece against said worktable while holding said means substantially fixed laterally relative to said cutting tool so that said means slides over said workpiece during said relative movement of said cutting tool and said worktable from the beginning of said cut until said cut is nearly completed, then releasing said means so that said means is laterally movable relative to said cutting tool when said cut is nearly complete and throughout the last increment thereof and causing said means to engage said cutout part and hold the same laterally fixed relative to said worktable during said last increment of said cut, and then releasing said cut-out part for removal from said worktable.

34. The method as recited in claim 33 in which said means when so released is caused to press said workpiece against said worktable upon said engaging of said workpiece thereby and to hold said workpiece clamped against said worktable by a frictional force.

35. The method as recited in claim 33 in which said means includes first and second members made annular and positioned so as to circumscribe said cutting tool.

36. The method as recited in claim 35 in which said first member is made of a material having a relatively low coefficient of friction, and said second mentioned member is made of a material having a relatively high coefficient of friction.

37. The method as recited in claim 35 in which said first and second members are so held in a predetermined position relative to said cutting tool when said means is so substantially fixed laterally, and including the step of returning said first and second members to said predetermined position upon said releasing of said part.

38. The method as recited in claim 35 in which said second member is held retracted relative to said workpiece and said first member until said cut is nearly completed, and is extended relative to said workpiece and said second member for so engaging said workpiece during said last increment of said cut.

* * * * *

Notice of Adverse Decision in Interference

In Interference No. 100,786, involving Patent No. 4,158,987, J. E. Smith, PRESSURE FOOT FOR MACHINE TOOL, final judgment adverse to the patentee was rendered June 7, 1984, as to claims 1, 2, 3, 4, 11, 13, 26 and 27.
*[Official Gazette January 29, 1985.]*